(12) United States Patent  
Frasco

(10) Patent No.: US 8,064,214 B2
(45) Date of Patent: Nov. 22, 2011

(54) PRESS FIT PASSIVE COMPONENT

(75) Inventor: Gary D Frasco, Whitehouse Station, NJ (US)

(73) Assignee: Dialogic Corporation, Montreal, Quebec (CA)

( * ) Notice: Subject to any disclaimer, the term of this patent is extended or adjusted under 35 U.S.C. 154(b) by 904 days.

(21) Appl. No.: 11/969,401

(22) Filed: Jan. 4, 2008

(65) Prior Publication Data

US 2009/0175012 A1   Jul. 9, 2009

(51) Int. Cl.
 *H05K 1/18* (2006.01)
 *H05K 1/11* (2006.01)
(52) U.S. Cl. ........ 361/763; 361/761; 361/762; 174/260; 174/261
(58) Field of Classification Search .................. None
 See application file for complete search history.

(56) References Cited

U.S. PATENT DOCUMENTS

| | | | | |
|---|---|---|---|---|
| 5,180,440 A * | 1/1993 | Siegel et al. | ......... | 136/230 |
| 5,538,433 A | 7/1996 | Arisaka | | |
| 5,865,642 A | 2/1999 | Rugg | | |
| 5,973,929 A * | 10/1999 | Arakawa et al. | ......... | 361/762 |
| 6,153,290 A * | 11/2000 | Sunahara | ......... | 428/210 |
| 6,362,525 B1 | 3/2002 | Rahim | | |
| 6,518,517 B2 * | 2/2003 | Baechtle et al. | ......... | 174/266 |
| 6,621,012 B2 * | 9/2003 | Crockett et al. | ......... | 174/261 |
| 6,657,136 B1 | 12/2003 | Liao et al. | | |
| 6,705,006 B2 | 3/2004 | Baechtle et al. | | |
| 6,809,268 B2 | 10/2004 | Hayashi et al. | | |
| 7,233,061 B1 | 6/2007 | Conn | | |
| 7,286,366 B2 * | 10/2007 | Zollo et al. | ......... | 361/761 |
| 7,350,296 B2 * | 4/2008 | Ryu et al. | ......... | 29/852 |
| 7,442,046 B2 | 10/2008 | Simonsson et al. | | |
| 7,672,140 B2 | 3/2010 | Lane | | |
| 7,791,896 B1 * | 9/2010 | Fan et al. | ......... | 361/765 |
| 7,891,980 B2 * | 2/2011 | Frasco | ......... | 439/65 |
| 2002/0033409 A1 | 3/2002 | Cilia et al. | | |
| 2002/0100611 A1 | 8/2002 | Crockett et al. | | |
| 2004/0118676 A1 | 6/2004 | Mizohata et al. | | |
| 2004/0130032 A1 | 7/2004 | Gronbeck et al. | | |
| 2006/0193118 A1 * | 8/2006 | Ahmad et al. | ......... | 361/760 |
| 2006/0203457 A1 * | 9/2006 | Busletta et al. | ......... | 361/761 |
| 2008/0072422 A1 | 3/2008 | Levante et al. | | |
| 2008/0251906 A1 | 10/2008 | Eaton et al. | | |

FOREIGN PATENT DOCUMENTS

WO   WO 03/049512   6/2003

OTHER PUBLICATIONS

C-Press "True" Compliant Press-Fit Connectors, Winchester Electronics, © 2008.
Winchester Electronics—C-Press Technology, 2007.
C-Press® "True" Compliant Press-Fit Connectors, Winchester Electronics, © 2008.
BGA Applicantion Guide. Tyco Electronic.

* cited by examiner

*Primary Examiner* — Boris Chervinsky
(74) *Attorney, Agent, or Firm* — Weingarten, Schurgin, Gagnebin & Lebovici LLP

(57) ABSTRACT

A press fit passive component, such as a resistor or capacitor, adapted to fit within, or partially within, a via of a printed circuit board. In one example, the press fit passive component has a cylindrically shaped body with solderable terminals at either end of the body, and a dielectric collar disposed at least partially about the cylindrically shaped body.

14 Claims, 8 Drawing Sheets

PRESS FIT PASSIVE COMPONENT

BACKGROUND

1. Field of Invention

The present invention relates generally to printed circuit boards and electronic components used thereon and, more particularly, to passive electronic components and printed circuit boards including passive components.

2. Discussion of Related Art

Passive components, such as resistors, capacitors and inductors, are commonly provided on printed circuit boards as surface mount (SMT) components. Referring to FIG. 1, there is illustrated one example of a standard surface mount resistor 100. The resistor 100 has a package body 102 with two solderable pads 104 for connecting the resistor to a printed circuit board. Surface mount passive components are generally fairly small. For example, a standard surface mount resistor, such as that illustrated in FIG. 1, may be approximately rectangular with a length, L, of about 0.040 inches (±0.002 inches), a height, h, of about 0.018 inches (±0.002 inches), and a width, w, of about 0.020 inches (±0.002 inches). However, despite the already small size of these components, the drive toward smaller and smaller electronic devices (e.g., cellphones or cameras), and thus, smaller and more densely populated printed circuit boards, makes placement of passive surface mount components on printed circuit boards challenging.

In particular, one common type of printed circuit board package is the ball grid array (BGA). A BGA uses an array of solder balls attached to its solderable pads on one side; it uses the solder balls to connect to the circuit board or other substrates. Generally BGAs have very limited space on which to place passive components, such as resistors. This limited space creates a challenge for optimal component placement. In addition, many printed circuit boards are now multi-layer boards and therefore, vias are used to connect surface mount components to signal traces on other board layers as well as to the solder balls of the BGA. For example, referring to FIG. 2, there is illustrated an example of a BGA circuit board 106 with solder balls 108 making up the BGA. Vias 112a and 112b, and traces 110a and 110b, are used to connect the surface mount resistor 100 to the BGA, as shown. The trace 110b forms an extra stub length, which can add undesirable inductance, but is required to connect the surface mount resistor 100 to the solder ball 108 of the BGA.

FIG. 3 illustrates an example of a vertical stub caused by a via connecting a surface mount resistor to inner signal layers of a multi-layer board. A surface mount resistor 100 is mounted on layer one (which is the top or bottom of the circuit board) of a multi-layer printed circuit board and connected (by its solderable terminals 104) to a signal trace 110. A via 112 is used to connect the surface mount resistor 100 to signal traces 116 on other layers. In the illustrated example, a via pad 114 couples the via 112 to a signal trace 116a on layer two, thereby forming a series connection of the trace 110, resistor 100 and trace 116a. The remaining length of the via 112 from layer three to the bottom via pad 118 on layer six is an extra vertical stub length that adds additional inductance and could act as an antenna.

An alternative to surface mount passive components are buried passive components. With buried passive components, for example, resistors, the resistor is screened onto an inner layer of the circuit board, generally in a rectangular area, as shown in FIG. 4. In FIG. 4, a buried resistor 120 is screened onto a signal layer 122 of a circuit board and connected to traces 116 and vias 112. Although the buried component 120 may be placed on a inner layer, thereby possibly eliminating a via needed to connect the component 120 from the top or bottom of the board to a signal trace on an inner layer, vias are still needed to form connections between the signal traces on different layers. Thus, the presence of the buried component 120 on the signal layer 122 actually uses up valuable via and signal trace space on the inner layers of the board.

SUMMARY OF INVENTION

Conventional surface mount and buried passive components present several disadvantages to circuit board designers. Accordingly, various aspects are directed to an alternative form of passive component, referred to herein as "press fit passive components," which may be adapted to fit within (or at least partially within) vias on a printed circuit board. Press fit passive components may take up far less space on a printed circuit board than do conventional surface mount or buried passive components, and may conveniently be placed directly within the vias taking signals to or from board connection points, such as the solder balls of a BGA.

According to one aspect, a press fit passive component comprises a body, collar disposed at least partially about the body, the collar comprising a non-conductive material, a first solderable terminal disposed at a first end of the body, and a second solderable terminal disposed at a second opposing end of the body. The press fit passive component may be, for example, a resistor, capacitor, diode or inductor. The collar may be a dielectric material, and in one example, is a compliant dielectric material. The collar may be disposed substantially about a center of the body. In one example, the body is substantially cylindrically shaped.

One aspect of a printed circuit board may comprise a substrate having a first surface and a second surface, the second surface being disposed substantially opposite and substantially parallel to the first surface, a via extending through the substrate from the first surface of the substrate to the second surface of the substrate, a press fit passive component disposed at least partially within the via, and a non-conductive collar disposed at least partially around a circumference of the press fit passive component and maintaining the press fit passive component within the via. In one example, the non-conductive collar is constructed and arranged to provide a gas tight seal between the press fit passive component and an inner wall of the via. In this example, the non-conductive collar may comprise a C-ring. The non-conductive collar may comprise a dielectric material. In another example, the press fit passive component has a substantially cylindrical body and the collar is disposed at least partially around a circumference of the substantially cylindrical body. In another example, the printed circuit board further comprises a conductive trace disposed on the first surface of the substrate and coupled to the via, and the press fit passive component may comprise a solderable terminal that can be soldered to the conductive trace. In one example, the press fit passive component can be contained entirely within the via, with the solderable terminal soldered substantially flush with the conductive trace. In this case, a surface mount component can be disposed above the via.

According to another aspect, a method of assembling a printed circuit board comprises inserting a press fit passive component into a via on the printed circuit board, and soldering solderable terminals of the press fit passive component to the via. This soldering may be done, for example, by wave soldering. In another example, the method also includes soldering a surface mount component over the press fit passive component, and the soldering step comprises applying solder paste to the solder terminal, applying solder paste to a pad for a surface mount component, placing the surface mount component on the pad, and soldering the surface mount component to the pad.

Another aspect is directed to a method of replacing a failed press fit passive component located within a via of a printed circuit board. The press fit passive component comprises a body, two solderable terminals and a non-conductive collar disposed at least partially about the body. The method comprises de-soldering the solderable terminals of the press fit passive component, and removing the press fit passive component from the via. In one example, the non-conductive collar is dielectric collar, and removing the press fit passive component from the via includes dissolving the dielectric collar using a chemical solvent. In another example, the method further comprises inserting a replacement press fit passive component into the via, and soldering solderable terminals of the replacement press fit passive component to the via.

Still other features and advantages of these exemplary aspects are discussed in detail below. Moreover, it is to be understood that both the foregoing information and the following detailed description are merely illustrative examples of various aspects, and are intended to provide an overview or framework for understanding the nature and character of the claimed aspects. The accompanying drawings are included to provide illustration and a further understanding of the various aspects, and are incorporated in and constitute a part of this specification. The drawings, together with the remainder of the specification, serve to explain principles and operations of the described and claimed aspects.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Figure 1:
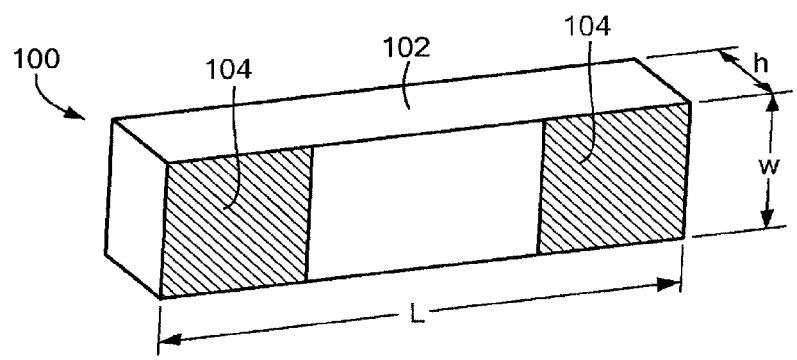
FIG. 1 is a diagram of one example of a conventional surface mount resistor.

It has been found that for several types of electronic devices, for example, some telecommunications devices, there is a need to terminate signal traces on the printed circuit board (pcb) with a series resistor in order to match impedance of a signal source (e.g., a driver pin) to the pcb transmission line. However, due to component spacing constraints and limited space on the circuit board for placing resistors, adding even one resistor to a printed circuit board design becomes difficult. Particularly, buried resistors may use up too much valuable horizontal surface area and via space, and the use of conventional surface mount resistors may degrade electrical performance of the device due to extra stub lengths created by the vias, as discussed above. Accordingly, to address these and other problems with conventional passive components, embodiments are directed to press fit passive components that may be located within (or at least partially within) vias on a printed circuit board. A resistor placed within a via, in accordance with one embodiment, may provide a favorable solution to the problem mentioned above in terms of both component spacing constraints and proximity to the location of the signal source, as discussed further below. Furthermore, according to one embodiment, press fit passive components may facilitate optimizing space on a printed circuit board to facilitate design or more compact printed circuit boards.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

According to one embodiment, a press fit passive component is a circuit element, such as a resistor, capacitor, diode or inductor, that comprises a housing, or body, designed to fit at least partially within a via on a printed circuit board, and a collar of pliable dielectric material disposed at least partially about the body. Most vias on standard printed circuit boards are cylindrical in shape. Therefore, in one embodiment, a press fit passive component may have a cylindrical body sized to fit within a standard-sized via. For example, vias may typically have a diameter of about 0.010 inches to 0.012 inches, and thus the press fit passive component may have a diameter slightly less than that range. In one example, the press fit passive component may have a similar, or smaller, size form factor to that of a standard surface mount passive component. However, it is to be appreciated that these examples are not intended to be limiting, and that press fit passive components according to various embodiments may have any size suitable for a particular printed circuit board design, whether or not that size is the same as or similar to any standard component or via sizes. In addition, press fit passive components are not limited to having cylindrically shaped bodies, and may have a body that is any shape (e.g., rectangular, trapezoidal, arbitrary, etc.) dictated only by the application for which the press fit passive component is intended (for example, by the shape of the via or other cavity into which the press fit passive component is to be inserted).

Figure 5:
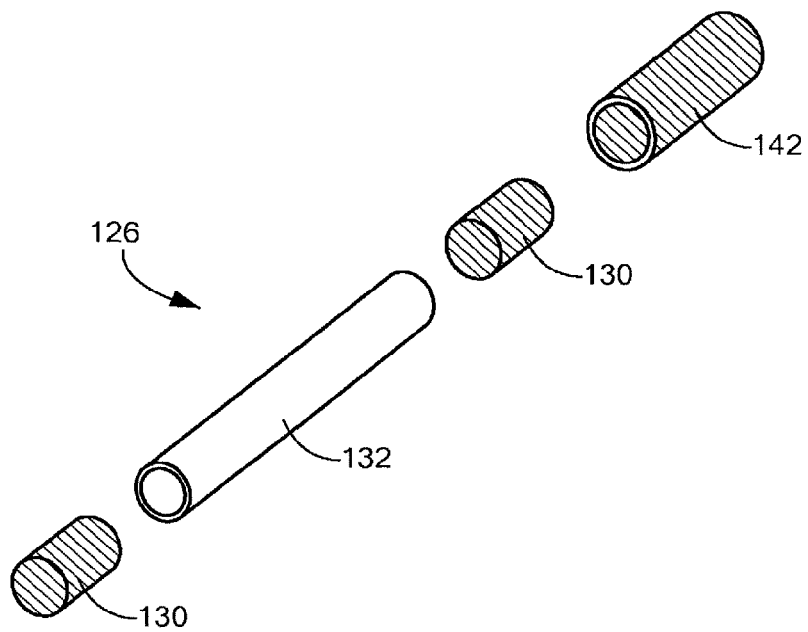
FIG. 5 is an exploded view of one example of a press fit passive component, according to aspects of the invention.

Referring to FIG. 5, there is illustrated an exploded view of one embodiment of a press fit passive component 126. The press fit passive component 126 includes a body 132 and two solderable terminals 130 disposed at either end of the body 132. In the illustrated example, the body 132 is cylindrical in shape; however, as discussed above, embodiments of the press fit passive component are not limited to being cylindrical in shape. A non-conductive collar 142 is disposed about a portion of the body 132. In one example, this collar 142 comprises a dielectric material. The dielectric material may comprise a pliable material that may be deformed under pressure, such as, for example, an elastic rubber, a polymeric material or foamed polymeric material. By way of non-limiting example, the pliable material can be polytetrafluoroethylene. According to one embodiment, the collar 142 may be made of a material that provides minimal insertion force, adequate stability, can withstand high temperatures, and is still pliable enough to close to a complete ring upon insertion. By way of non-limiting example, the material can be a thermoset or thermoplastic polymer material. In addition, in some examples it may be desirable to have the dielectric collar 142 made of a material that is dissolvable (e.g., using certain solvents) so as to allow easy removable of the press fit passive component 126 should it be defective or misplaced. In one embodiment, the dielectric collar 142 may be placed around an approximate center of the body 132. However, it is to be appreciated that other placements of the dielectric collar 142 are also possible.

Figure 6:
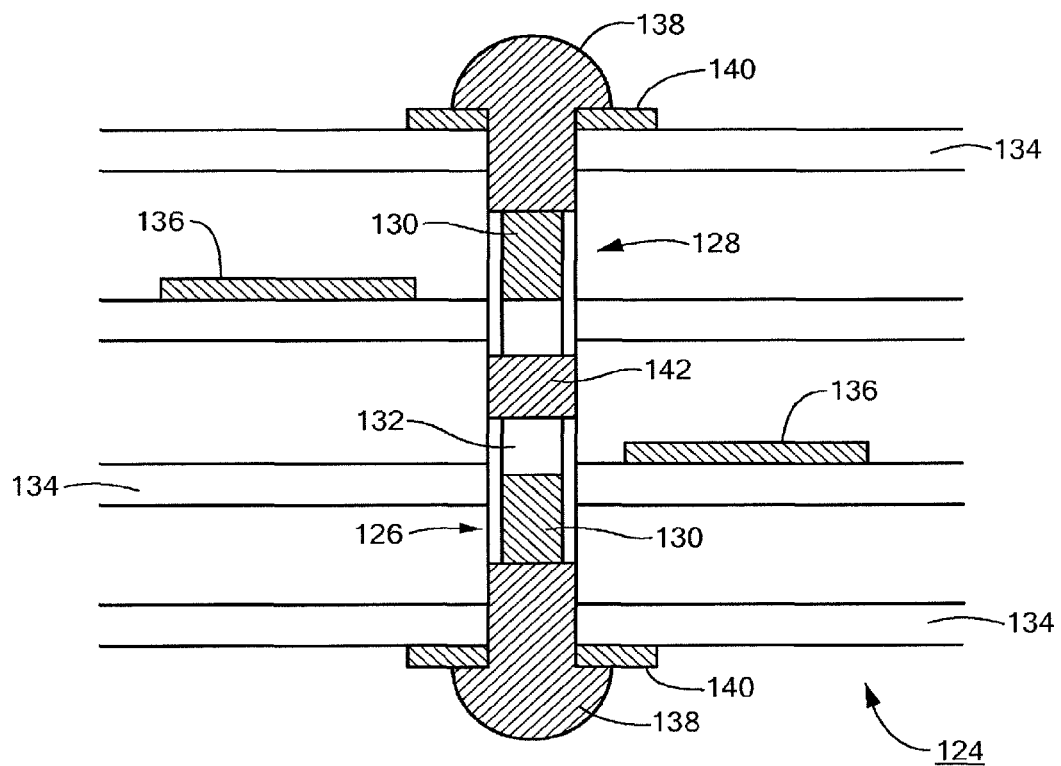
FIG. 6 is a vertical cross sectional view of a multi-layer printed circuit board having a press fit passive component located within a via, according to aspects of the invention.

Referring to FIG. 6, there is illustrated in cross-section a portion of a multi-layer printed circuit board 124 including a press fit passive component 126 inserted within a via 128, in accordance with one embodiment. The via 128 extends through the multiple layers 134 of the printed circuit board 124, at least some of which have signal traces 136 disposed thereon. Solder 138 may be used to provide electrical connection to the press fit passive component 126. For example, the solder 138 may connect the solderable terminals 130 of the press fit passive component 126 to via pads 140 which may, in turn, be connected to signal traces (not shown) on the printed circuit board 124. According to one embodiment, solder 138 may be deposited over the via 128 and via pads 140, such that it contacts the solderable terminals 130 of the press fit passive component 126, and standard heat processes (such as those used to solder surface mount components to a printed circuit board) may be used to melt the solder 138 and bond the press fit passive component 126 to the via pad 140, as discussed further below.

Figure 7:
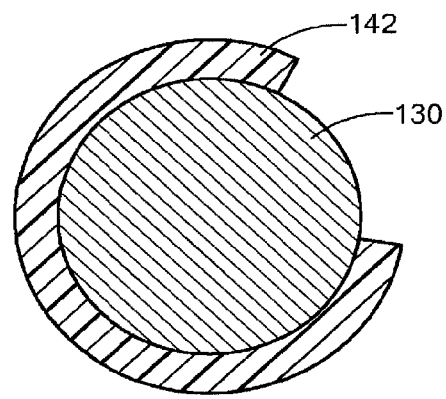
FIG. 7 is a radial cross-sectional diagram of one example of a press fit passive component according to aspects of the invention.
Figure 8:
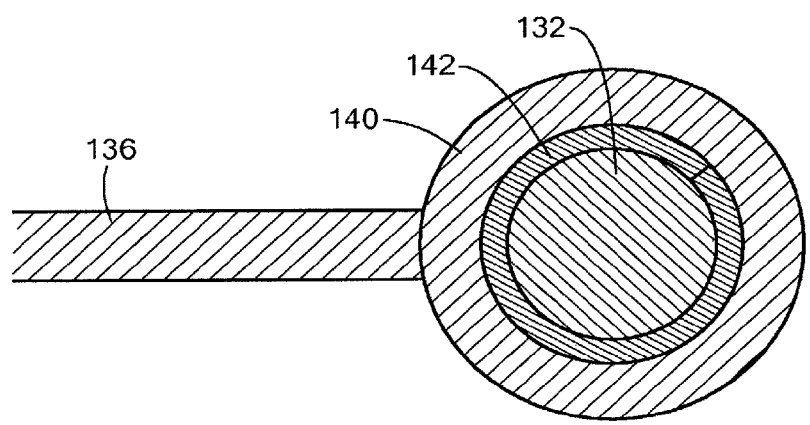
FIG. 8 is a top view of a via having a press fit passive component located therein in accordance with aspects of the invention.
Figure 9:
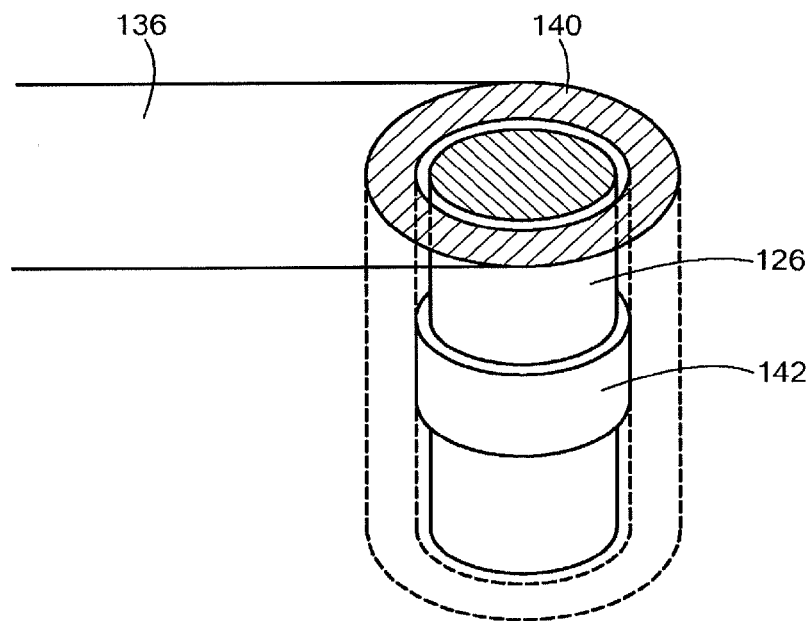
FIG. 9 is a perspective view of the via of FIG. 8 having the press fit passive component located therein.

As discussed above, the press fit passive component 126 includes a dielectric collar 142 disposed about at least a portion of the body 132. The dielectric collar 142 may serve to secure the press fit passive component 126 within the via 128, particularly prior to soldering. In one embodiment, the dielectric collar 142 may comprise a C-ring, as illustrated in FIG. 7. When the press fit passive component 126 is inserted (press fit) into the via 128, the C-ring may be compressed to form a gas tight seal around the press fit passive component 126. This is illustrated, in top view, in FIG. 8. The dielectric collar 142 may thus isolate one solderable terminal 130 from the other and prevent solder 138 from leaking through the via 128 and "shorting out" the press fit passive component 126.

According to one embodiment, the via 128 may include conductive plating (not shown) along a portion of the via sides, for example, extending as far down the via as to reach the solderable terminals 130 of the press fit passive component 126. However, the via 128 should have no conductive plating along at least an interior portion, for example, the area approximately corresponding to the location of the dielectric collar 142, so as to prevent a short circuit from being formed across the press fit passive component 126. According to one embodiment, CAD (computer aided design) software can be designed to accommodate press fit passive components. In particular, the CAD software can be adapted to allow placement of a press fit passive component 126 within a via 128, and to specify plating of the via only on certain layers (such as the top and bottom layers, but not some inner layers).

Figure 2:
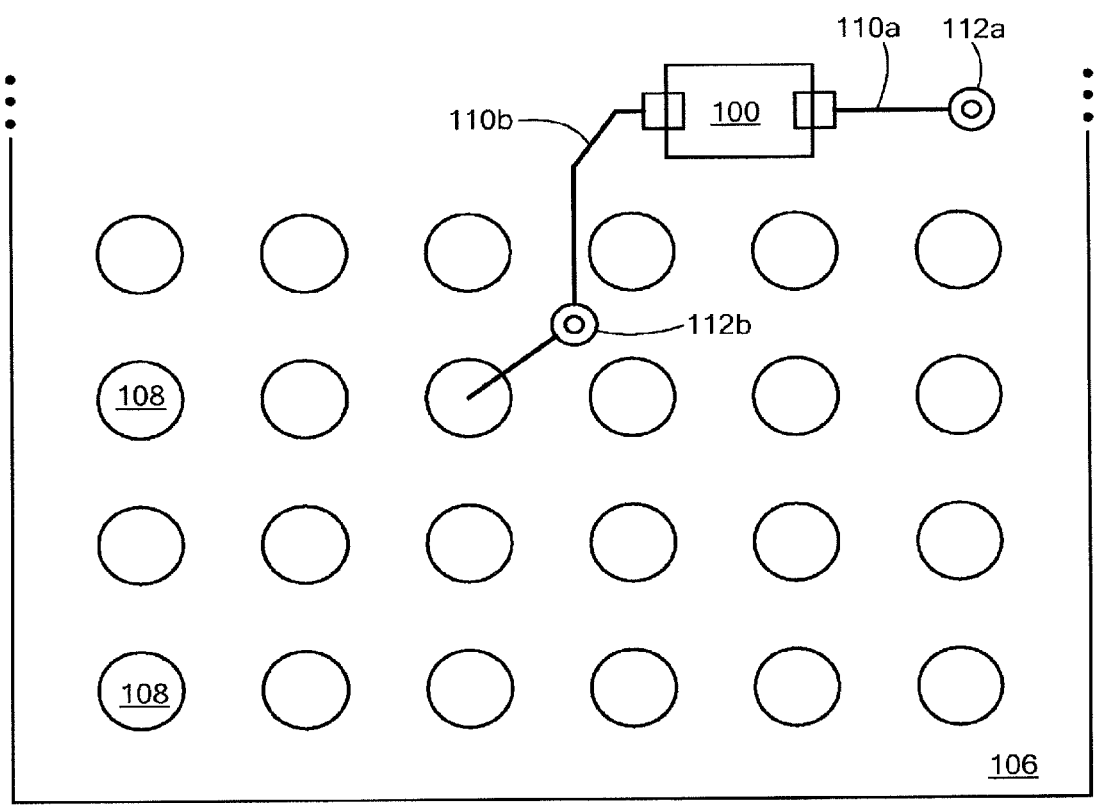
FIG. 2 is a diagram of one example of a conventional ball grid array (BGA) including the surface mount resistor of FIG. 1.
Figure 3:
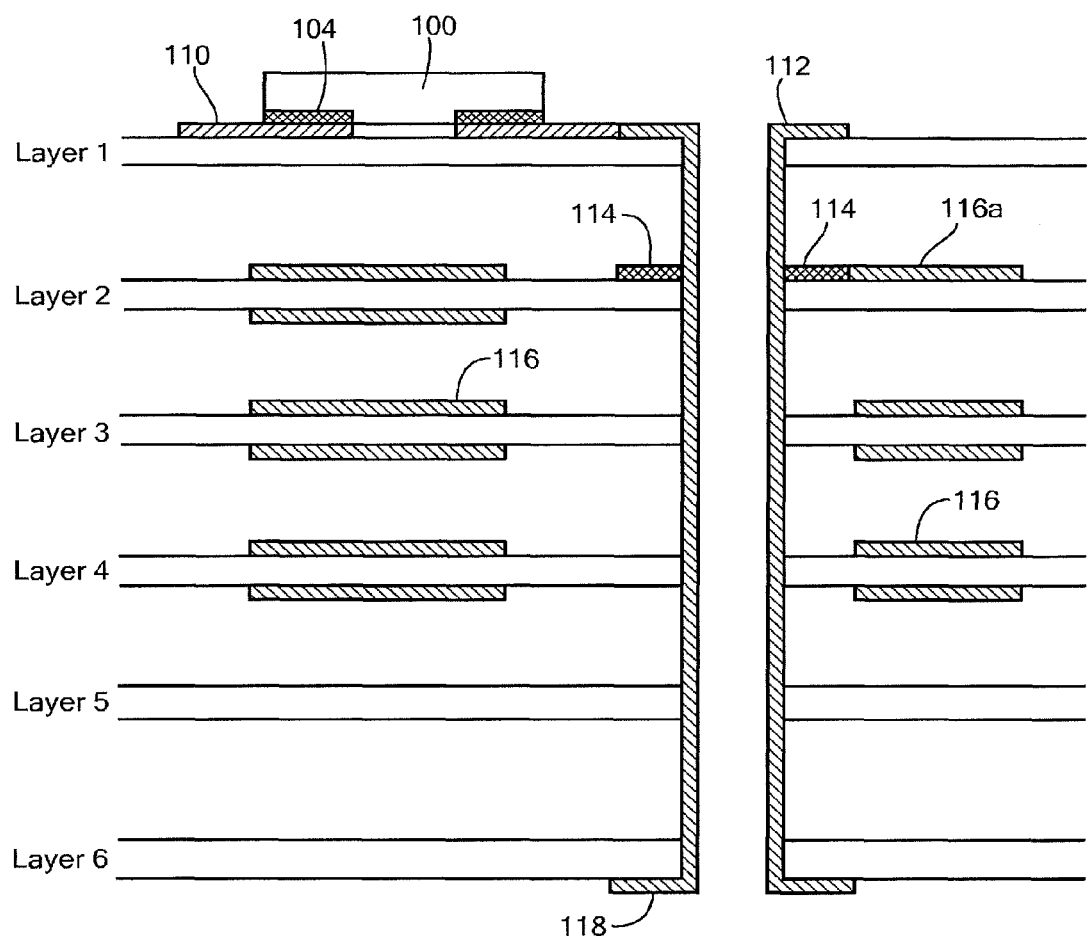
FIG. 3 is a vertical cross-sectional view of one example of a conventional multi-layer printed circuit board including the surface mount resistor of FIG. 1.
Figure 4:
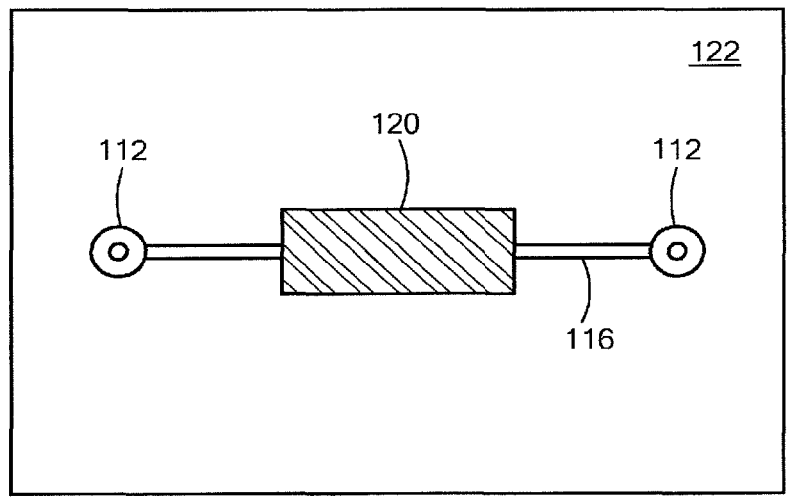
FIG. 4 is a diagram of one example of a conventional buried resistor.
Figure 10:
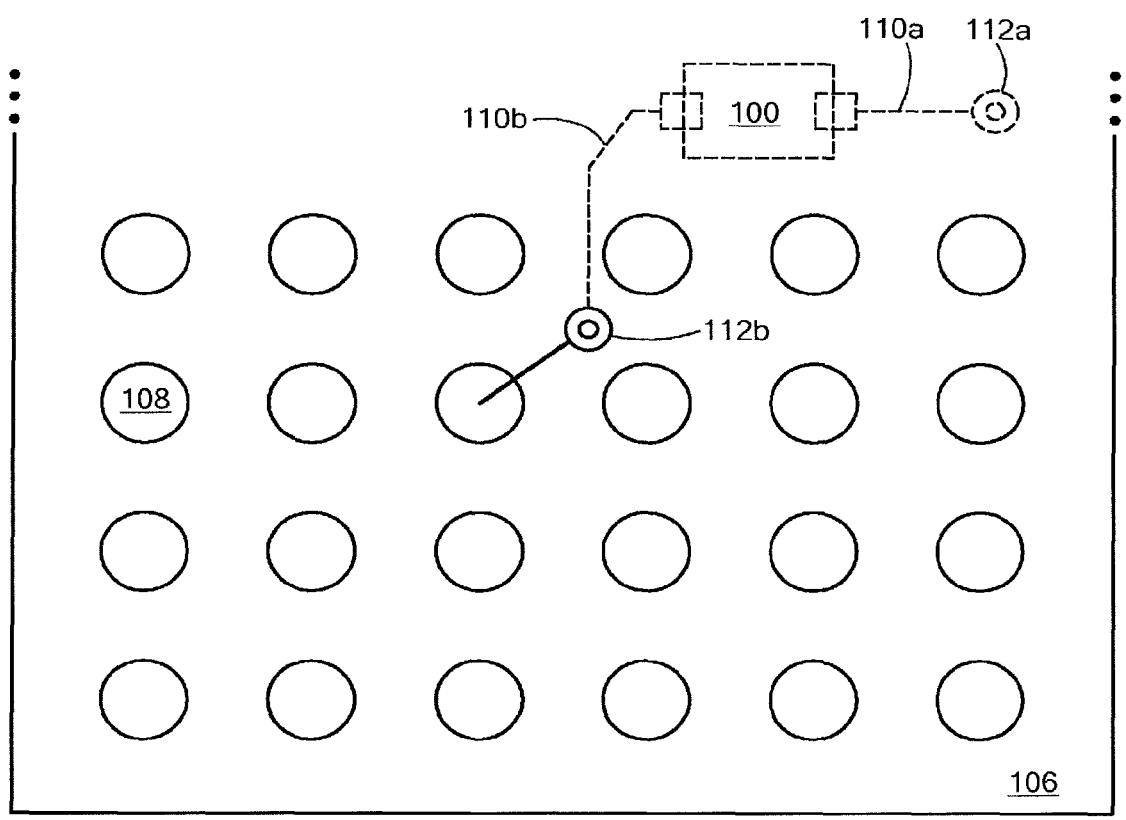
FIG. 10 is a diagram of one example of a BGA showing a press fit passive component replacing a conventional surface mount component, in accordance with aspects of the invention.

Press fit passive components according to various embodiments may provide several advantages to printed circuit board designers and manufacturers. For example, by using press fit passive components located within vias, a printed circuit board designer may no longer need to add the extra vias and traces that were required to connect a surface mount component to appropriate signal traces (as shown in FIG. 2). Rather, referring to FIG. 10, a press fit passive component (not shown) may be placed directly in the via 112*b* that takes the signal from the BGA to the inner layers, obviating the need for the traces 110*a* and 100*b* and the extra via 112*a*. Reducing the number of vias may decrease the cost of the printed circuit board and free up more space for signal traces. Furthermore, the press fit passive component takes up limited horizontal space on the printed circuit board, in one example, far less space than is used by conventional surface mount passive components (such as resistor 100) or buried passive components. For example, a conventional surface mount resistor of the 0402 size, together with its vias, takes up approximately 2400 sq. mils of surface area, whereas a press fit passive component would require only the surface area of the via in which the component is located, which is about 576 sq. mils. Accordingly, a press fit passive resistor can provide approximately 75% savings in board surface area compared to a conventional surface mount resistor. Thus, press fit passive components may save considerable component space on the printed circuit board and facilitate the production of higher density printed circuit boards. In addition, elimination of via 112*a* and traces 110*a* and 100*b* will also eliminate the vertical stub (see FIG. 6) before the signal reaches the resistor. As discussed above, these vertical stubs cause unwanted inductance and can act as antennas, which can degrade the electrical performance of the board. Therefore, removal of these vertical stubs can be advantageous, particularly for high-speed devices, such as, for example, telecommunications devices.

Figure 11:
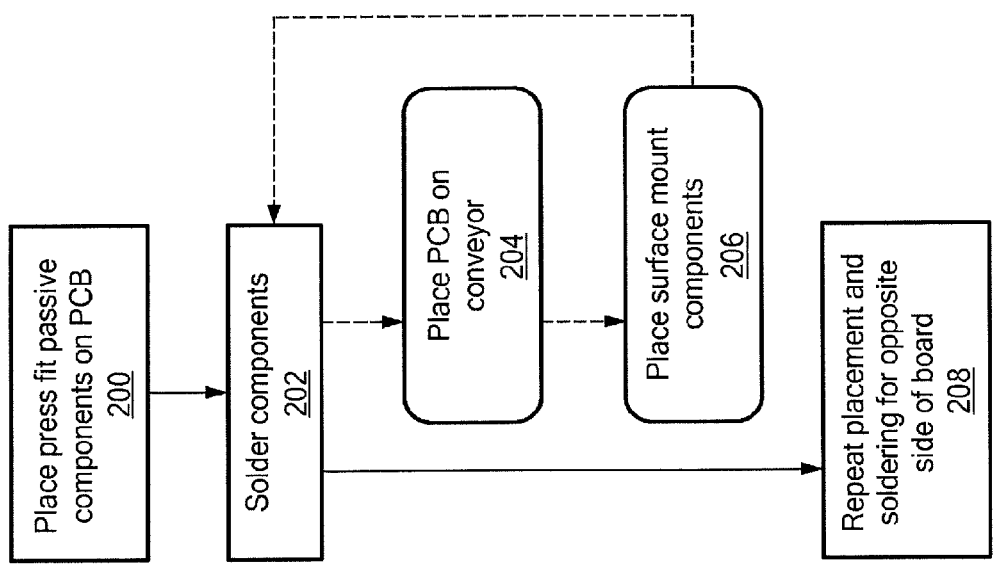
FIG. 11 is a flow diagram illustrating one example of a method of assembly for a printed circuit board according to aspects of the invention.

According to one embodiment, a method of producing a populated printed circuit board may include placing a press fit passive component on the printed circuit board before or during the process of populating the board with other active and/or passive surface components. Referring to FIG. 11, there is illustrated a flow diagram of one example of such a method. It is to be appreciated however, that the order of steps presented in FIG. 11 is one example only and not intended to be limiting, and that embodiments of methods of assembling printed circuit boards may use more or fewer steps than, or may be otherwise modified as compared to, those illustrated in FIG. 11, and may implement those steps in an order different to that shown in FIG. 11. In some applications, it may be currently preferable to place any press fit passive components on the printed circuit board before other surface mount components are placed. Thus, a first assembly operation on the printed circuit board (step 200) may include placing the press fit passive components on the prepared printed circuit board. However, it is to be appreciated that this need not be the case, and other components may be placed (and optionally soldered) before placement of press fit passive components on the printed circuit board. It is further to be appreciated that "press fit passive components" as used herein is intended to refer to one or more press fit passive components.

Conventional surface mount components are generally supplied in reels that are fed into a component dispensing machine. The reels hold the discrete components in such a manner that the dispensing machine can be easily fed. Similarly, in one embodiment, press fit passive components may be supplied in reels that may be fed into a dispensing machine adapted to accommodate press fit passive components. For example, the dispensing machine may include a press-fit insertion tool that may take a press fit passive component from the reel and press the component into a prepared via on the printed circuit board.

In one embodiment, a fixture may be used to hold the printed circuit board stationary while the press fit passive components are inserted into prepared vias. In conventional assembly of printed circuit boards having surface mount components, mechanical fixtures are used to hold the printed circuit boards as the boards are moved from one dispensing station to another and the components are placed on the board. Therefore, the same, or a similar, fixture may be used to hold the printed circuit boards during placement of the press fit passive components. A plate made of a substantially inflexible substance may be placed under the printed circuit board and pressed flush to the printed circuit board from the bottom of the board. This plate may prevent the press fit passive components from being pushed through the printed circuit board. A press-fit insertion tool may be used to press the component into the printed circuit board. The press-fit insertion tool may be controlled to exert sufficient force on the press fit passive component so as to insert it without damaging the press fit passive component. In one example, the press-fit insertion tool may be controllable (e.g., by way of a user interface) so as to adjust the insertion force based on, for example, the material used for the dielectric collar on the press fit passive component.

Figure 12:
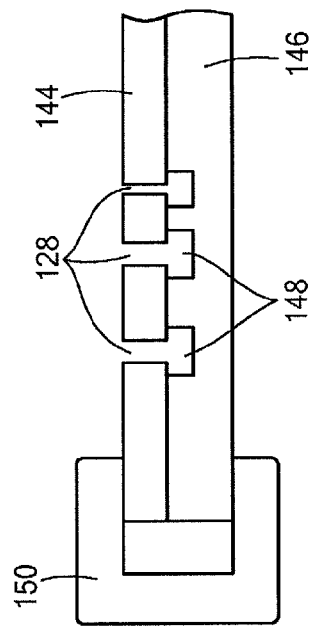
FIG. 12 is a cross-sectional diagram of one example of a printed circuit board and underlying plate, according to aspects of the invention.

In some applications, the press fit passive component may extend out from the via above one or both of the top and bottom surfaces of the printed circuit board. In such instances, the underlying plate may have holes formed therein that correspond to the locations of the vias through which the press fit passive component(s) may extend. Referring to FIG. 12, there is illustrated a printed circuit board 144 having a plurality of vias 128 (at least some of which may receive press fit passive components) formed therein. A plate 146 is held against the bottom surface of the printed circuit board 144 by the fixture, a portion 150 of which is schematically illustrated in FIG. 12. The plate 146 has a plurality of holes 148 formed therein, as discussed above. In one example, as illustrated in FIG. 12, the holes 148 are shown as being slightly larger than the vias 128, and thus larger than the press fit passive components, in order not to damage the press fit passive components. However, it is to be appreciated that the holes 148 may be formed having substantially the same size as the vias 128, or may be larger than the vias. It will be appreciated that the location of vias 128 on different printed circuit boards 144 can be different. Therefore, in one example, each type of printed circuit board 144 may have a corresponding plate 146 having holes 148 precisely drilled (or otherwise formed) therein to correspond to the locations of the vias 128.

Figure 13:
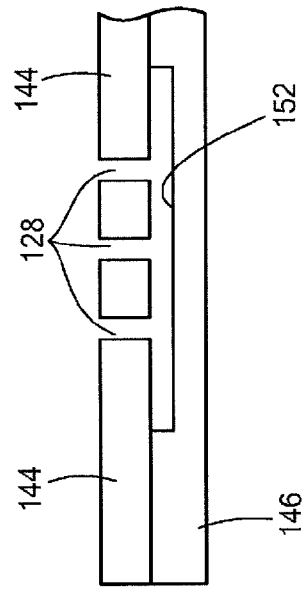
FIG. 13 is a cross-sectional diagram of the printed circuit board of FIG. 12 illustrating another example of an underlying plate in accordance with aspects of the invention.

Alternatively, as shown in FIG. 13, rather than having multiple precisely located holes 148, the underlying plate 146 may have a recessed surface 152 that may correspond to a majority of the surface area of the printed circuit board 144 (but leaving a rim around the recessed surface to allow the plate 146 to be clamped to the printed circuit board 144). Having this recessed surface 152, rather than a plurality of precisely located holes 148, may allow one plate 146 to be used for multiple different printed circuit board layouts. The depth of the holes 148 (or recessed surface 152) may be dependent on the height of the exposure of the press fit passive component from the surface of the printed circuit board 144. Therefore, in one example, controlled-depth-drilling may be used to form the holes 148 (or recessed surface 152) to a desired depth.

As discussed above, press fit passive components may be provided in reels, similar to conventional surface mount components. In one example, the placement of the press fit passive component in the reel may define the polarity direction of the press fit passive component, top or bottom on the printed circuit board 144. If all of the press fit passive components were designed to have one type of polarity, either negative or positive on the top of the board, the press-fit operation may be done in one step. Alternatively, if some press fit passive components have an opposite polarity to others, the board 144 may be flipped (e.g., by rotating the fixture) over to the opposite side for a second press-fit operation. Rotating fixtures are known in the art and are commonly used with surface mount component dispensing machines that do not have rotatable dispensing heads, in order for the non-rotatable dispenser heads to account for the direction of the polarity of the component on the printed circuit board 144. The rotating fixture may also accommodate integrated circuits (ICs), which may be rotated in different directions. Accordingly, in at least one example, such an existing fixture, or a modification thereof, may be used to hold and rotate the printed circuit board 144 during placement of the press fit passive components. When the board 144 is flipped, the underlying plate 146 may be moved from one side of the board to the other, or the plate may be removed and another plate attached to the new underside of the board. In some conventional manufacturing operations, the dispenser may have a rotating head that will rotate to account for the direction of the polarity of the component on the printed circuit board 144. Therefore, in at least one example, the dispenser/insertion tool for press fit passive components may have a rotating head, thus obviating the need to rotate the printed circuit board 144 with the fixture. Alternatively, a reel of press fit passive components with the opposite polarity may be provided and loaded into the dispensing machine/insertion tool.

Referring again to FIG. 11, after placement/insertion of the press fit passive components is complete, the press fit passive components may be soldered in place (step 202). In one example, a technique generally known in the art as wave soldering may be used to implement this step. Alternatively, a solder dispensing tool may be used to apply solder paste to the solderable terminals of the press fit passive component(s) on one side of the board 144. In this case, step 202 may also include applying solder paste to the solderable pads of any surface mount components that are to be placed on that side of the printed circuit board 144. The printed circuit board 144 may then be placed in clamps on a conveyor belt (step 204). The conveyor belt runs past multiple stations where mechanical dispensers press any surface mount components onto the board 144. Of course, if there are no surface mount components to be added to the printed circuit board 144, the method may skip step 204. Next, the board 144 may be sent to an infrared (IR) oven where the solder paste is melted, creating a solder joint (step 202). This procedure may then be repeated for the opposite side of the board (step 208).

As discussed above, in some examples, press fit passive components may extend from the via 128 above the surface of the printed circuit board 144. According to another embodiment, press fit passive components may be designed to fit entirely within a via 128, such that the component may fit below the surface of the printed circuit board 144. In this case, the press fit passive component may be soldered flush with the surface of the printed circuit board 144. Then, surface mount components may be placed over soldered-in press fit passive components. In one example, the body of the surface mount component may be placed above the press fit passive component, with its solderable pads being on either side of the press fit passive component. This arrangement may avoid the need to solder on top of an already existing solder joint (i.e., the solder joint connecting the press fit passive component to the via pad).

In another example, the press fit passive component may be placed underneath a solderable pad for surface components such as gull wing, j-leaded or quad-pack devices. In another example, the press fit passive component may be located directly beneath a solder ball of a BGA. In this case, the assembly process may include a step of soldering the surface mount components to the pre-existing solder joints. Such "double soldering" may be accomplished, for example, by using a high melt-temperature solder paste to solder the press fit passive components, and then using a lower melt-temperature solder to solder the surface mount components. The difference between the two melt-temperatures for the different solder compounds may allow the surface mount components to be soldered on top of the press fit passive component solder joints without melting the existing joints. Alternatively, a method may include electrical or chemical plating over the ends of the press fit passive component. Surface mount components may then be soldered or otherwise attached to the plating.

The ability to mount surface mount components above press fit passive components may provide a substantial savings in component space on the printed circuit board since the press fit passive component would take up no surface area on the board. However, even in embodiments in which the solderable end(s) of the press fit passive component protrude out of the printed circuit board on either or both sides, the press fit passive component may still take up far less horizontal surface area on the board than do conventional surface mount devices. Thus, press fit passive components may provide a substantial advantage to printed circuit board designers and manufacturers by reducing component surface area, which may allow smaller and/or more densely populated circuit boards to be produced.

After the assembly process takes place, the printed circuit board may be tested for any faults prior to packaging and shipment to a customer. According to one embodiment, installed press fit passive components may be tested before other components are installed on the printed circuit board. Thus, referring to FIG. 14, in the board assembly method flow diagram, a step 210 of testing the press fit passive components may be included prior to placement of any surface mount components. Where the solderable terminals of the press fit passive component are exposed (e.g., the press fit passive component extends above the surface of the printed circuit board or, even if the press fit passive component is soldered flush with the printed circuit board, no component is placed above it), the press fit passive component may be easily tested with a clamshell tester or by probing from both sides of the printed circuit board simultaneously. However, if the press fit passive component is placed underneath a surface mount component pad (i.e., is concealed), other methods of testing may be required. For example, the concealed press fit passive component may be tested using x-ray technology. X-ray testing is currently preferred if, for example, the press fit passive component is placed between two surface mount devices located on the top and bottom surface of the printed circuit board. Alternatively, a thin wire may be guided, using a theoretically guided program, underneath the surface mount component to a designated pin on either side of the printed circuit board simultaneously so as to test the press fit passive component.

Figures 14, 15:
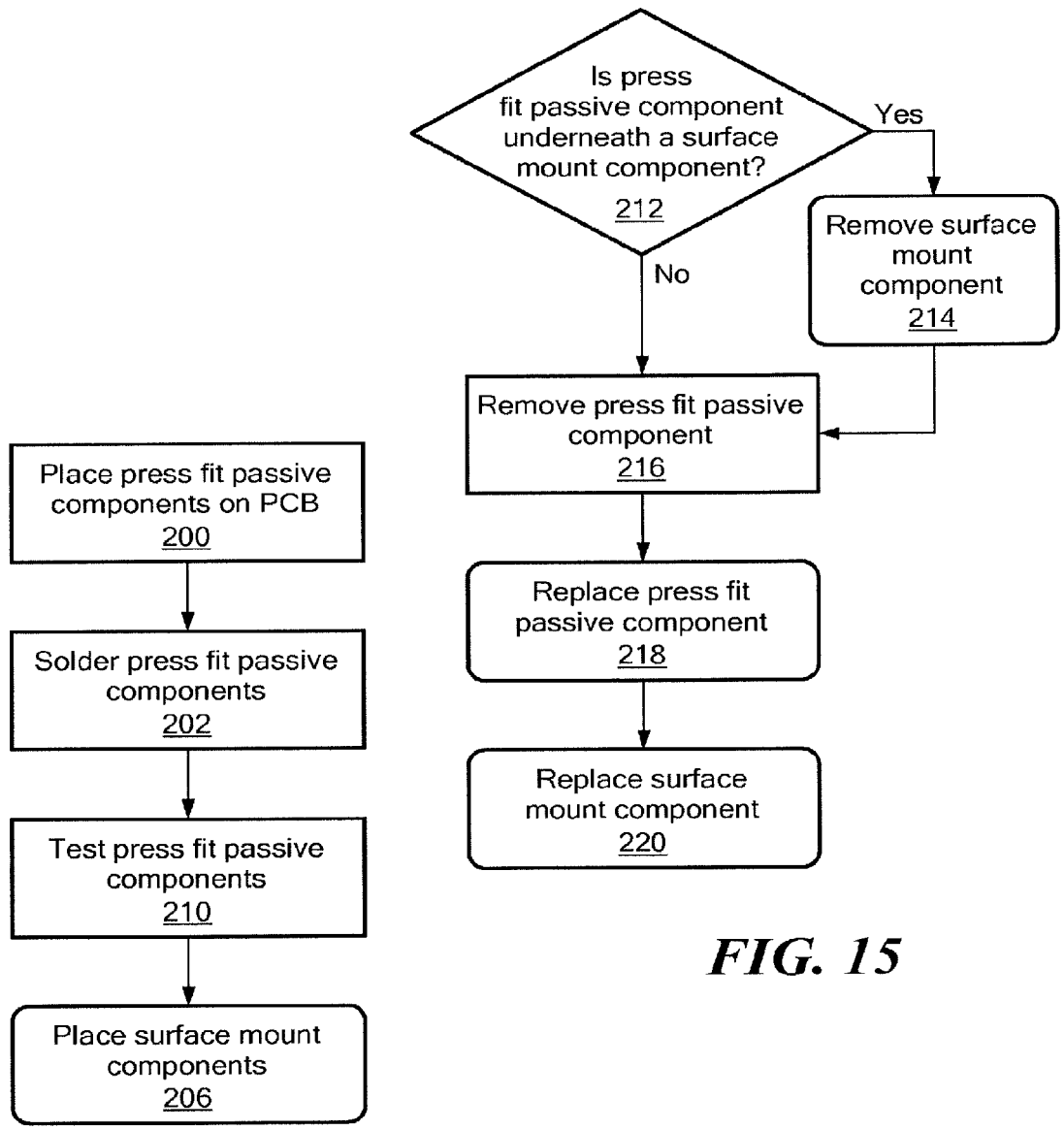
FIG. 14 is a flow diagram of one example of a method of printed circuit board assembly according to aspects of the invention.
FIG. 15 is a flow diagram of one example of a method of reworking a printed circuit board to replace a damaged press fit passive component.

According to one embodiment, if a press fit passive component fails, for example, or is cracked from the insertion force and/or exposure to high temperatures (e.g., during soldering), then a rework process may be implemented to replace the component. Referring to FIG. 15, there is illustrated a flow diagram of one example of a rework process to replace a press fit passive component. The steps in the rework process may vary depending on whether or not the press fit passive component is located beneath a surface mount component, as indicated by block 212.

If the press fit passive component is not underneath a surface mount device, each side of the press fit passive component may be easily de-soldered (step 214). This de-soldering may be accomplished using tools and techniques known in the art. After the press fit passive component has been de-soldered, it may be removed from the via (step 216). As is currently preferred, removal of the press fit passive component may be achieved without damaging the printed circuit board. If the press fit passive component is located underneath a surface mount pad, the surface mount device would have to be removed first. Removal of the surface mount component (step 218) may be achieved using conventional tools and techniques, as known to those skilled in the art.

According to one embodiment, a tool for removing press fit passive components may include a shaped piece of metal with a hole in the center to support the bottom of the printed circuit board, and a punch that would push the press fit passive component out of its via. In one example, the shaped piece of metal may be cylindrical. If only a few press fit passive components need to be removed, the tool may be implemented as a hand tool. Alternatively, to accommodate removal of many press fit passive components, the printed circuit board may be held stationary in a fixture, and a computer driven machine may manipulate the tool to remove the press fit passive component. For example, the machine may manipulate the cylindrical metal piece both vertically and horizontally under the printed circuit board in unison, with the punch on either the top or bottom of the printed circuit board.

According to another embodiment, removal of the press fit passive component may include dissolving the dielectric collar, for example, using a chemical solvent. As discussed above, the dielectric collar may serve to secure the press fit passive component within the via. Therefore, when the dielectric collar is dissolved, the press fit passive component may be more easily removed from the via.

Referring again to FIG. 15, after removal, a failed press fit passive component may be replaced by inserting a new press fit passive component into the via and soldering the solderable terminals (step 218). If appropriate for the design, the same (or a new) surface mount component may be soldered above the press fit passive component (step 220), for example, by using the double soldering and/or plating techniques discussed above.

Having thus described several features of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A component for insertion within a via located in a substrate, comprising:
    a passive electrical device having first and second ends and an outer diameter;
    a first solderable terminal having an outer diameter, the first solderable terminal being mechanically and electrically coupled to the first end of the passive electrical device; and
    a second solderable terminal having an outer diameter, the second solderable terminal being mechanically and electrically coupled to the second end of the passive electrical device; and
    a non-conductive collar disposed at least partially around and partially along a length of at least one of the passive electrical device, the first solderable terminal, and the second solderable terminal,
    wherein the collar has an outer diameter that is greater than each of the outer diameters of the passive electrical device, the first solderable terminal, and the second solderable terminal, and
    wherein the passive electrical device is one of a resistor, a capacitor, a diode or an inductor.

2. The component as claimed in claim 1, wherein the collar comprises a dielectric material.

3. The component as claimed in claim 2, wherein the dielectric material is a compliant material.

4. The component as claimed in claim 1, wherein the collar is disposed substantially about a center, length-wise, of the passive electrical device.

5. The component as claimed in claim 1, wherein the passive electrical device is substantially cylindrically shaped.

6. A printed circuit board comprising:
    a substrate having a first surface and a second surface, the second surface being disposed substantially opposite and substantially parallel to the first surface;
    a via extending through the substrate from the first surface of the substrate to the second surface of the substrate;
    a passive electrical component disposed at least partially within the via, the passive electrical component comprising:
        a passive electrical device having first and second ends and an outer diameter;
        a first solderable terminal having an outer diameter;
        a second solderable terminal having an outer diameter;
        the first solderable terminal being mechanically and electrically coupled to the first end of the passive electrical device; and
        the second solderable terminal being mechanically and electrically coupled to the second end of the passive electrical device; and
        a non-conductive collar disposed at least partially around and partially along a length of at least one of the passive electrical device, the first solderable terminal and second solderable terminal,
    wherein the collar has an outer diameter that is greater than each of the outer diameters of the passive electrical device, the first solderable terminal and the second solderable terminal, and
    wherein the passive electrical device is one of a resistor, a capacitor, a diode or an inductor.

7. The printed circuit board as claimed in claim 6, wherein the non-conductive collar is constructed and arranged to provide a gas tight seal between the passive electrical component and an inner wall of the via.

8. The printed circuit board as claimed in claim 7, wherein the non-conductive collar comprises a C-ring.

9. The printed circuit board as claimed in claim 6, wherein the non-conductive collar comprises a dielectric material.

10. The printed circuit board as claimed in claim 6, wherein the passive electrical device comprises a substantially cylindrical body, and wherein the non-conductive collar is disposed at least partially around a circumference of the substantially cylindrical body.

11. The printed circuit board as claimed in claim 6, further comprising a conductive trace disposed on the first surface of the substrate and coupled to the via.

12. The printed circuit board as claimed in claim 11, wherein one of the first solderable terminal and the second solderable terminal is soldered to the conductive trace.

13. The printed circuit board as claimed in claim 11, wherein the passive electrical component is contained entirely within the via; and wherein one of the first solderable terminal and the second solderable terminal is soldered substantially flush with the conductive trace.

14. The printed circuit board as claimed in claim 13, further comprising a surface mount component disposed above the via.

* * * * *